United States Patent [19]

Thiele

[11] Patent Number: 4,914,626

[45] Date of Patent: Apr. 3, 1990

[54] MAGNETIC BUBBLE MEMORY DEVICE

[76] Inventor: Alfred A. Thiele, 262 N. Dithridge St., #306, Pittsburgh, Pa. 15213

[21] Appl. No.: 87,788

[22] Filed: Aug. 21, 1987

[51] Int. Cl.$^4$ ............................................. G11C 19/08
[52] U.S. Cl. ....................................... 365/39; 365/34; 365/38
[58] Field of Search ...................... 365/38, 39, 33, 34, 365/41

[56] References Cited

U.S. PATENT DOCUMENTS

| 3,996,572 | 12/1976 | Keefe et al. | |
| 4,003,768 | 1/1977 | Anderson et al. | 365/30 |
| 4,264,985 | 4/1981 | George et al. | 365/38 |
| 4,330,848 | 5/1982 | Gambino et al. | 365/34 |
| 4,414,647 | 11/1983 | Kabelac | 365/41 |
| 4,415,990 | 11/1983 | Gergis et al. | 365/41 |
| 4,424,577 | 1/1984 | Gergis et al. | 365/41 |

FOREIGN PATENT DOCUMENTS

| 34374 | 3/1980 | Japan | 365/39 |
| 117474 | 6/1985 | Japan | 365/43 |

OTHER PUBLICATIONS

IEEE Transactions on Magnetics–vol. Mag–16, No. 5, Sep. 1980, pp. 864–866.
Hendel, R. J., *IBM Technical Disclosure Bulletin*, vol. 15, No. 8, Jan. 1973, "Laminated Structures for Bubble Domain Devices".
Ahn, K. Y., *IBM Technical Disclosure Bulletin*, vol. 18, No. 12, May, 1976, "Bubble Device Fabrication".
Thompson, D. A., *IBM Technical Disclosure Bulletin*, vol. 19, No. 6, Nov. 1976, "Bubble Domain Sensor".

*Primary Examiner*—James W. Moffitt
*Attorney, Agent, or Firm*—Birch, Stewart, Kolasch & Birch

[57] ABSTRACT

An improved magnetic bubble memory device includes a continuous propagator overlay on a sheet of magnetic material. The propagator overlay being adapted to reduce the statistical switching effects and overall coercivity of the propagator overlay. The propagator overlay consists of multiple layers of soft magnetic material being alternately arranged with non-magnetic material, in a geometric pattern specified so as to produce domain walls only internal to the pattern boundary, the soft magnetic material being chosen for its initial low coercivity characteristics and having characteristics approaching zero magneto-striction.

11 Claims, 5 Drawing Sheets

MAGNETIC BUBBLE MEMORY DEVICE

FIELD OF THE INVENTION

The present invention relates to a magnetic bubble memory device. More particularly, the invention is directed to a device having gapless, laminated field access propagators as soft magnetic overlays of a sheet of magnetic material in which the bubbles (domains), are formed.

DESCRIPTION OF THE RELATED ART

Magnetic bubble memories are used in digital computers as sequential mass memory devices. Such memory devices consist of a sheet of magnetic material having a preferred direction of magnetization which is out of the plane of the sheet. The sheet, in the absence of an externally applied magnetic field, normally arranges its magnetization into regions (domains) having their magnetization pointed either in the direction of the sheet normal or in the opposite direction so that it produces a net magnetization of zero.

Bubbles can be formed in the sheet by applying a magnetic field along the sheet normal of a magnitude in a range determined by the sheet material parameters and thickness. This field breaks the symmetry between the positive and negative normal directions of the sheet and allows it to be magnetized stably and uniformly. It also allows regions of reverse magnetization (bubbles) to be introduced (nucleated) by local fields (or other means) which are also stable and mobile as more or less fixed entities. At a particular position, a bubble either exists or not. The bubble memory stores binary data as a "0" or "1" bit as indicated by the presence or absence of a bubble at a particular position.

Once a given bubble has been nucleated (or not), it is propagated across the sheet region then, producing a shift register. The bubbles must, of course, be detectable in order to recover the information from the magnetic material.

A number of methods for propagating the bubbles within the magnetic sheet have been proposed. One such method is to produce a patterned soft magnetic overlay upon the magnetic material sheet and produce a magnetic field rotating in the plane of the sheet material. This structure propagates the bubbles within the magnetic material sheet. Overlay patterns can be either gapped or gapless. The known forms of both these methods have certain disadvantages. The bubbles magnetically stick to induced image poles in the propagate elements, and the field must overcome this sticking effect in a gapped propagator.

Gapped propagators generally require large applied drive fields in order to overcome this sticking effect. It might be assumed that a reduction in coercivity of the material forming the propagator elements would reduce the required applied field for propagation; however, with gapped propagators, decreasing the coercivity of the propagating material could actually increasing the sticking effect.

Even in gapless propagators, internal domain patterns form which lock up and only allow propagation at high applied fields, if at all.

Bubble memory devices are generally organized in one of two ways, either a reentrant loop device, or a major loop-minor loop device.

FIG. 1 illustates a reentrant loop bubble device. The loop 1 of the bubble propagator includes a read device 3 which detects a data output from the loop, a bubble annihilator 5 and a generator 7 which produces a data input into the magnetic bubble memory.

FIG. 2 illustrates a major loop-minor loop device. The major loop 9 includes the read device 3, bubble annihilator 5 and generator 7 which correspond to those elements of the reentrant propagate loop of FIG. 1. The minor loops 11 are connected to the major loop 9 at points 10. This arrangement provides a greater flexibility. The minor loops 11 comprise the great bulk of data storage. The major loop can access data in any one of the minor loops. The result is a reduction in the average time required to move a bubble from an arbitrary position to the read-generator section of the major loop as compared to the long shift register represented by the reentrant loop of FIG. 1. The average access time is in fact only a few times the average time it would take to move the bubbles from the storage position to the read write position in a straight line. A second result is that it is possible, by external programming, to mask defective minor loops, thus ignoring them in operation.

SUMMARY AND OBJECTS OF THE INVENTION

Accordingly, it is a primary object of the present invention to produce a field access magnetic bubble memory device having a reduction in the required applied field for propagating bubbles within the sheet of magnetic material beneath the propagators.

It is a further object of the present invention to provide propagators having a reduced effective coercivity, in particular, with respect to statistical switching effects produced in the propagate elements by the coercivity so as to reduce the required applied filed for propagating magnetic bubbles through a sheet of magnetic material reliably.

The above objects of the present invention are fulfilled by providing a sheet of magnetic material having a preferred direction of magnetization out of the plane of said sheet and a continuous overlay disposed on a first side of said sheet, said continuous overlay including a plurality of stacked magnetically soft films, each magnetically soft film being alternately arranged with a layer of non-magnetic material.

The magnetically soft films can be either of a permalloy type, a supermalloy type or an amorphous type.

Magnetically soft films whose magnetostriction is approximately zero are preferred.

The continuous overlay has a geometry so that any cusp in the boundary points internally rather than externally.

The continuous overlay may also have a geometry such that a major loop including at least one minor loop is produced for shifting a plurality of domains formed on said sheet of magnetic material.

The layout of the bubble device may be such that the domains propagate for an applied field in said plane of said sheet having a first rotational direction in part of the device while in the remainder of the device, the bubbles hold position while for rotation in the opposite direction the roles of the two parts of the device are reversed. Alternatively, the major and minor loops may both propagate for field rotation in a first direction holding position for rotation in the second direction with small transfer loops propagating for rotation in the second direction while holding position for rotation in the first direction.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
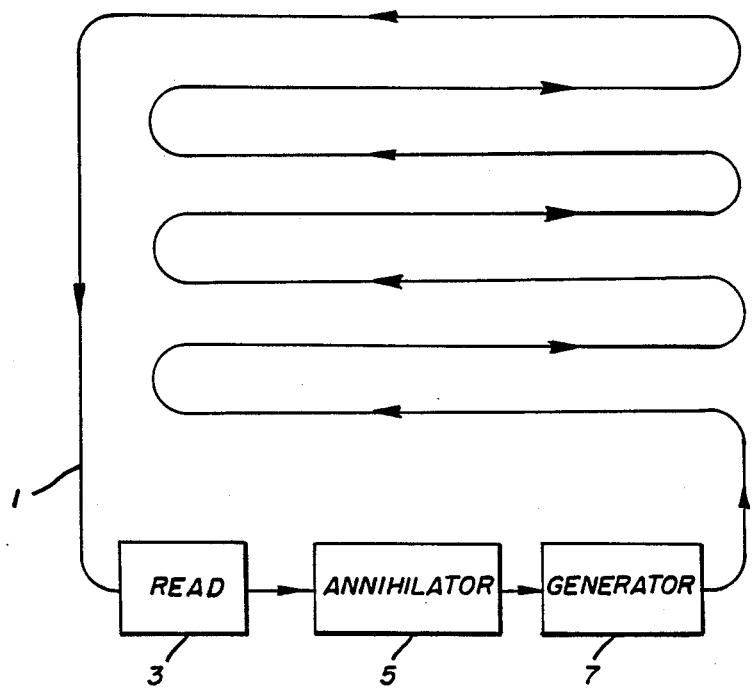
FIG. 1 illustrates a conventional reentrant propagate loop.
Figure 2:
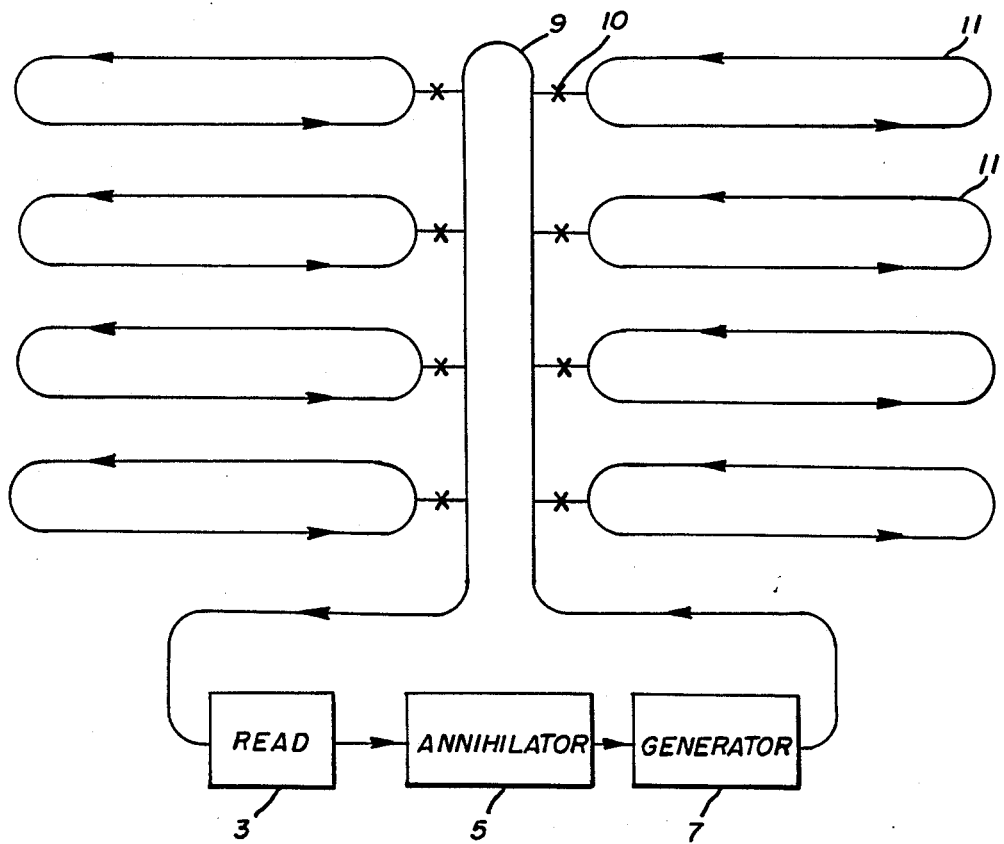
FIG. 2 illustrates a conventional major-minor loop configuration for a magnetic bubble memory.

As described above, FIGS. 1 and 2 illustrate two different bubble memory configurations. FIG. 1 illustrates a long shift register configuration which includes a single loop 1 having a read device 3, which is used to detect data in a loop, a bubble annihilator 5, which can remove a bubble which has already been detected by the read device, and a generator 7 which can generate new data to be stored in the memory device. In FIG. 2, the memory is divided into a major loop 9 and a plurality of minor loops 11. When it is necessary to access specific data, the transfer gates are simultaneously activated, transferring one bit of information from each minor loop. This transfers one word of information into the major loop for processing by the read device 3, annihilator 5 and generator 7.

The interaction of the magnetization with the crystal lattice in the magnetic bubble material is described by an energy density, $E_k = K_u B_1^2 + (K_u + K_o) B_2^2$, where $B_1$, $B_2$ and $B_3$ are the direction cosines of the magnetization, the $B_3$ direction is approximately the sheet normal direction and $K_u$ and $K_o$ are positive coefficients. In order for bubbles to be statically stable, $K_u > 2\pi M_s^2$ where $M_s$ is the saturation magnetization. Although in bubble device operation is attainable for $K_o = 0$, it is desirable for dynamic stability purposes to have $K_o/2\pi M_s^2 >> 0$ (orthorhombic anisotropy). In addition, the thickness of the magnetic film is in the range of 4l to 8l where $l = \sigma_w/4\pi M_s^2$ where $\sigma_w$ is the wall energy density.

Figure 3:
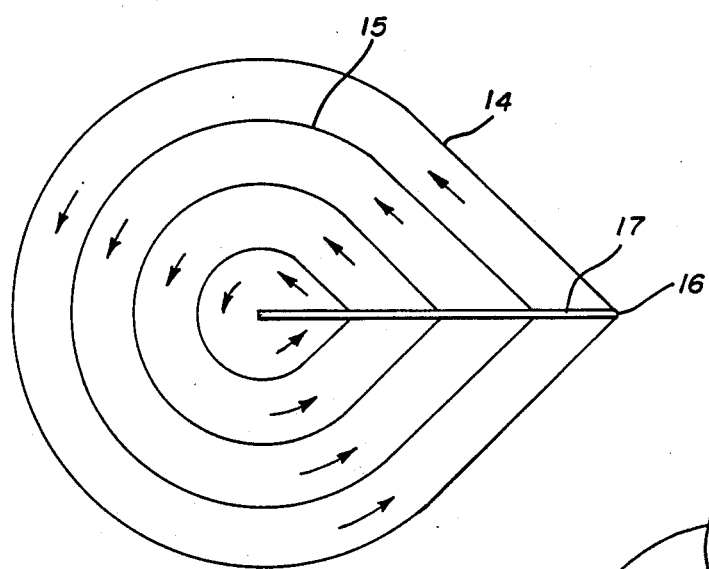
FIG. 3 illustrates a feature of the magnetization direction and domain wall relationship in an overlay pattern with an outward pointing cusp.
Figure 4:
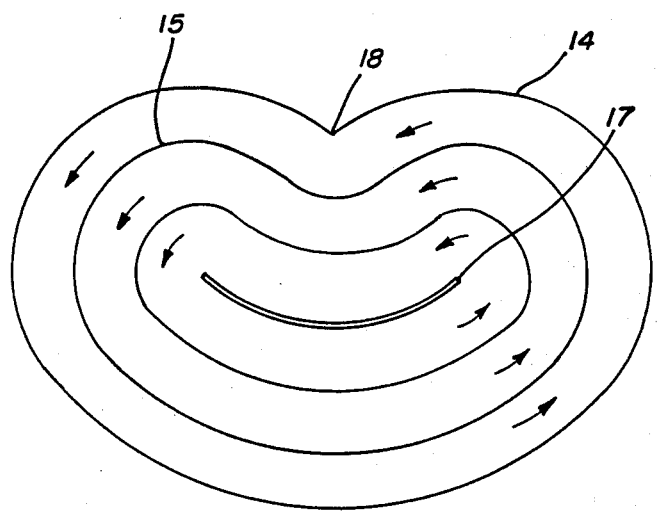
FIG. 4 illustrates the corresponding feature of magnetization direction and domain wall relationship in an overlay pattern with an internally pointing cusp.

It has been discovered that it is beneficial for the bubble memory device to allow the boundaries of the soft magnetic film to have only internally pointing cusps. FIGS. 3 and 4 illustrate different configurations of magnetization direction and the resulting domain walls. In FIG. 3, 14 is the boundary of the soft magnetic material which forms the case of an outwardly pointing cusp in the propagator film overlay boundary. The domain wall 17 terminates in the outwardly extending cusp 16. Line 15 illustrates the magnetization field direction streamlines.

In FIG. 4, soft magnetic overlay boundary 14 has an internal cusp 18 and the domain wall 17 is completely internal with respect to the domain wall boundary. Once again, the line 15 illustrates the direction of magnetization streamlines.

When a rotating field is applied in the plane of these patterns, that is the plane of the sheet of the material, the net magnetization changes because of both a rotation of the magnetization and a movement of the domain walls 17. If the applied field rotates in the plane, maintaining an approximately fixed magnitude, then it is clear that the susceptibility of the configuration will be both higher and less erratic when the domain walls 17 float freely within the structure rather than being anchored to an edge. These required characteristics are the characteristics of the inward cusp, internal domain wall configuration of FIG. 4.

Figure 5:
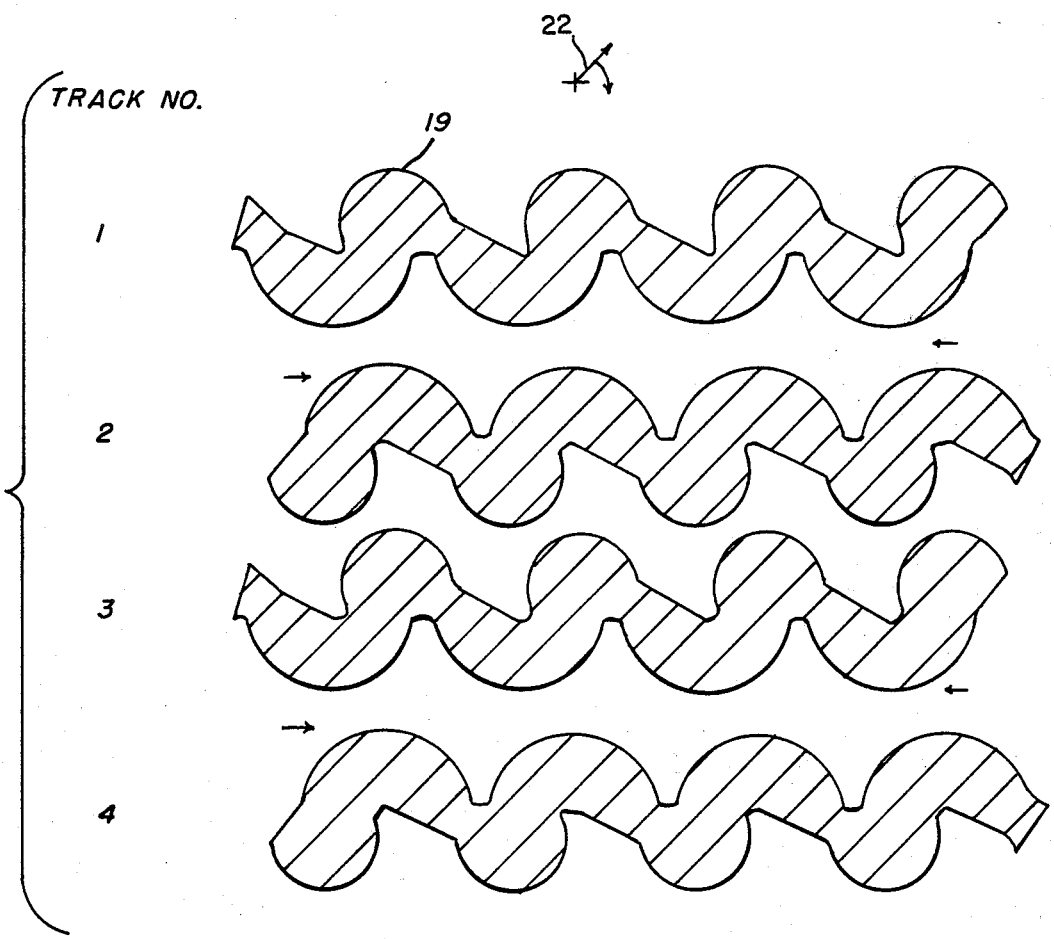
FIG. 5 illustrates a propagator geometry in accordance with a preferred embodiment of the present invention which produces only the relationship illustrated in FIG. 4.
Figure 6A:
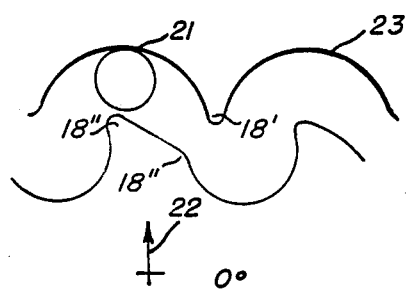
FIGS. 6(a)-6(f) and 7(a)-7(f) illustrate the movement of the bubble domains within a sheet of magnetic material in accordance with the preferred embodiment of the present invention.
Figure 6B:
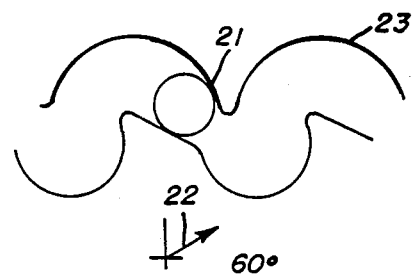
Figure 6C:
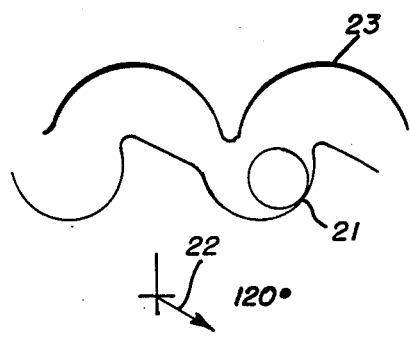
Figure 6D:
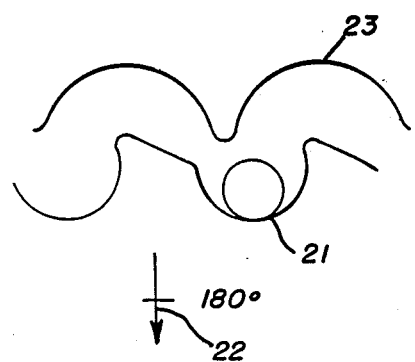
Figure 6E:
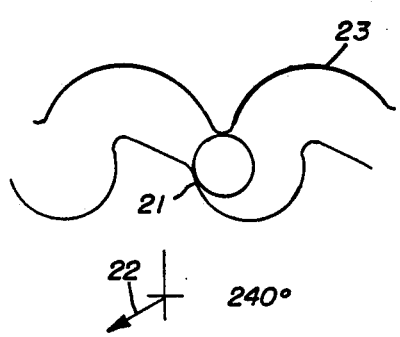
Figure 6F:
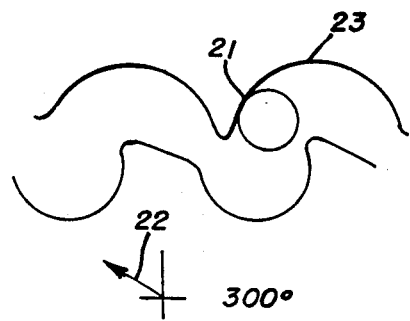
Figure 7A:
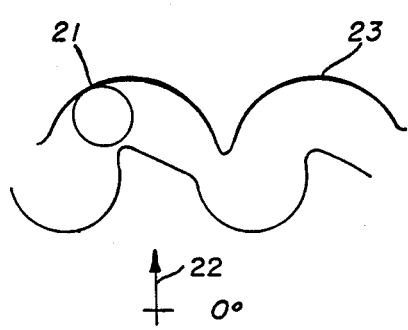
Figure 7B:
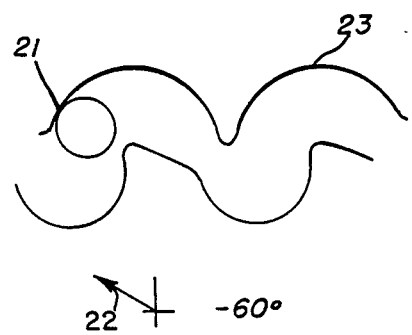
Figure 7C:
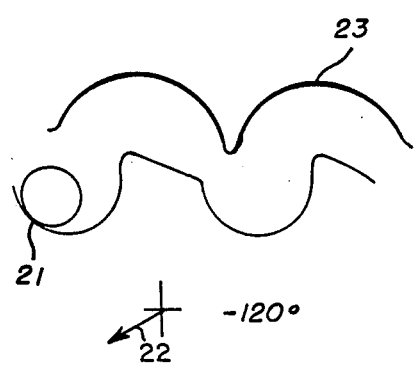
Figure 7D:
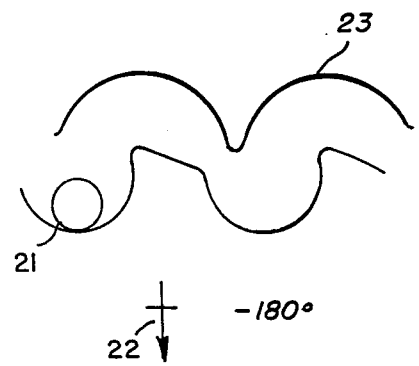
Figure 7E:
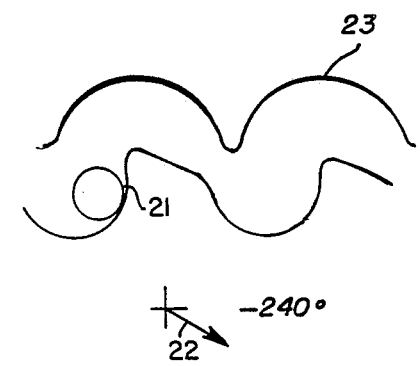
Figure 7F:
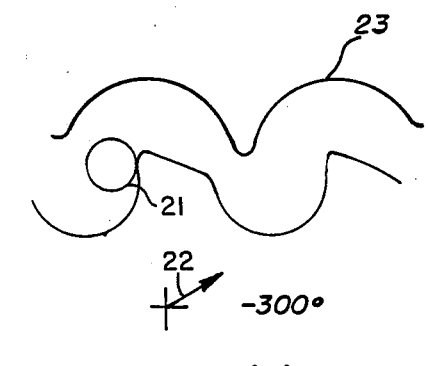

FIG. 5 illustrates a continuous propagator overlay pattern which assures that the preferred mobile internal domain wall will be attained. In FIG. 5, the shaded area 19, corresponds to a soft magnetic overlay. For an applied transverse magnetic field, rotating in a clockwise direction, tracks 1 and 3 propagate bubbles to the left while tracks 2 and 4 propagate bubbles to the right. If the direction of rotation of the applied magnetic field is reversed, then the bubbles oscillate at their positions under the soft magnetic overlay and are not propagated.

FIGS. 6(a) to 6(f) show the relative positions of a bubble, 21 in accordance with the propagator pattern 23 at various phases of a rotating drive field indicated by arrow 22 for clockwise rotation.

FIGS. 7(a)-7(f) illustrates the position of a bubble 21 along a propagator pattern 23 at various phases of the rotating drive field as indicated by arrow 22 for a counterclockwise rotation which results in oscillation of the bubble or no propagation.

A bubble memory can be designed which is of a major-minor loop configuration, whereby clockwise rotation causes propagation only in minor loops while counterclockwise rotation causes propagation only in the major loop. This provides a method for independently controlling the two classes of propagation. Alternatively, the major and minor loops may both propagate for field rotation in a first direction holding position for rotation in the second direction with small transfer loops propagating for rotation in the second direction while holding position for rotation in the first direction.

In order to reduce the field power required for reliable propagation, three techniques can be utilized: (1) gapless (contiguous) propagator patterns with only internal cusps are allowed; (2) the propagator pattern material is laminated; and (3) a material having a low magnetostriction value and low coercivity is used.

The improvement produced by the combination of (1) and (2) is greater than the sum of the improvements produced by the use of either alone. In fact, lamination of a gapped propagator may actually increase drive power requirements by causing the bubbles to stick more tightly to the propagate elements.

Figures 8, 9:
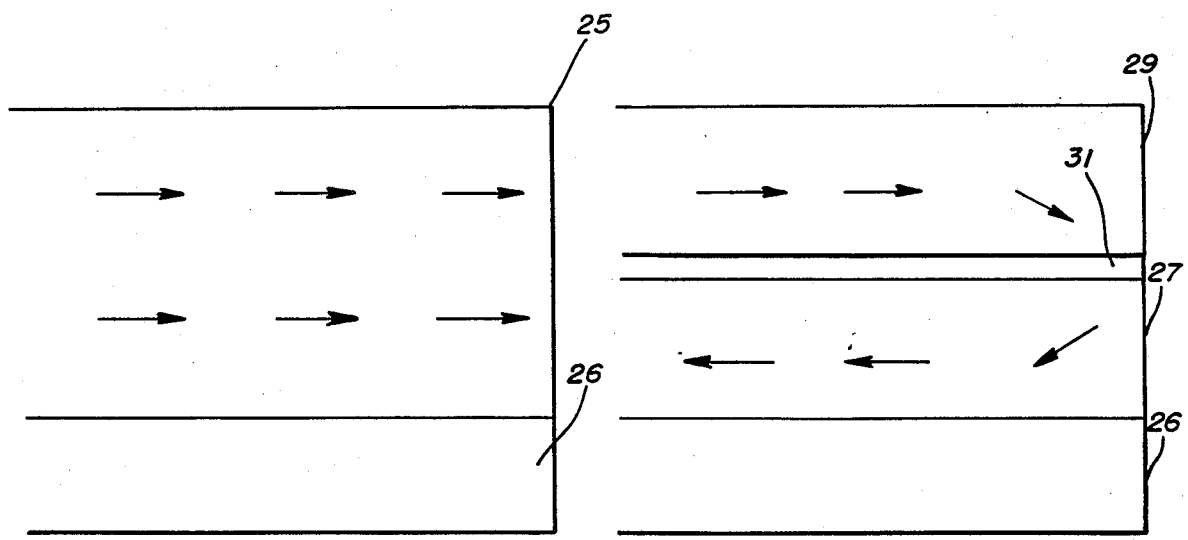
FIG. 8 illustrates a cross section of the magnetization in a conventional single layer propagator.
FIG. 9 illustrates a cross section of the magnetization in a propagator of a preferred embodiment of the present invention.

FIGS. 8 and 9 illustrate the difference between the conventional magnetic bubble memory structure and the structure of a preferred embodiment of the present invention.

In FIG. 8, a conventional bubble memory structure has a single film, soft magnetic propagator pattern 25 overlayed on a sheet of magnetic material 26 in which the domains are produced. In accordance with an embodiment of the present invention, a propagator overlay pattern is produced from at least two soft magnetic layers, 27 and 29 which are separated by a non-magnetic material 31. This latter structure of FIG. 9 constitutes a lamination of multiple soft magnetic layers to produce a propagate overlay for a sheet of magnetic material for a magnetic bubble memory device.

The net coercivity of the propagator layer is reduced due to the lamination.

In FIG. 9 the overlay pattern is laminated and near the edge of each layer of film, the magnetization is always rotated out of the plane to some extent so that there will be some regions in which the magnetization rotates immediately upon the application of an applied field in the plane. This means that the laminated film overlay will always have rotated regions near the edge of the film from which changes in domain configuration can begin when the applied field is varied. The availability of such regions in which flux reversal can begin in a laminated film also causes a decrease in the overall reversal time. Since laminated structures always have regions from which switching can begin, lamination reduces the statistical effects which occur in a reorientation of the magnetization in an unlaminated film under the influence of an applied in plane field. In an unlaminated film the magnetic configuration can occasionally attain a form which is difficult to switch. This produces large statistical effects which are eliminated by lamination.

It should be noted that in continuous, gapless film propagators, the laminations act to nucleate changes in the domain structure in place of the gap of magnetizing fields in gapped propagator devices. The combination of a continuous propagator with a lamination removes the requirement that the bubbles be detached from one structure and re-attached to another in order to propagate as in the gapped devices, while allowing the domains in the drive structure to still change easily in accordance with the effect of the lamination in nucleating changes of domain structure.

The third technique for reducing the overall coercivity is to use propagator materials as overlays having reduced coercivity. Preferred soft magnetic overlay materials include permalloys, supermalloys and amorphous type materials. A supermalloy can be produced by the addition of copper and molybdenum to a permalloy. When using an amorphous film it is also possible to greatly reduce the magnetostriction of the material having a low coercivity. Amorphous films having a large cobalt content can attain approximately a zero magnetostriction. It is preferable to attain such a low magnetostriction.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A magnetic bubble memory device in which a sheet of magnetic material is magnetized so as to produce a plurality of domains or bubbles, comprising:

a gapless overlay disposed on a first side of the sheet so as to produce a propagator pattern to allow a shifting of the plurality of domains along the sheet, said gapless overlay including a plurality of stacked, magnetically soft films, each magnetically soft film being alternately arranged with a layer of non-magnetic material, said overlay further including an elongated propagator pattern having a pair of opposing boundary edges, one of said edges being comprised of a plurality of generally convex semicircles serially coupled together in relatively close proximity to generate intermediate inwardly pointing cusps and thereby defining a respective plurality of domain propagation regions, and the other edge of said edges being comprised of a plurality of generally convex relatively smaller semicircles offset from the semicircles of said one edge and being coupled together by generally non-circular intermediate edge segments and generating respective inwardly pointing cusps at the ends thereof with the semicircles coupled thereto and thereby defining a respective plurality of domain latching regions between adjoining pairs of propagation regions.

2. The magnetic memory device of claim 1 wherein said magnetically soft films are of a permalloy type.

3. The magnetic memory device of claim 1 wherein said magnetically soft films are of a supermalloy type.

4. The magnetic memory device of claim 1 wherein said magnetically soft films are of an amorphous type.

5. The magnetic memory device of claim 4 wherein said magnetically soft films have a magnetostriction of approximately zero.

6. The magnetic memory device of claim 1 wherein said continuous overlay has a geometry such that a major loop, including at least one minor loop, is produced for shifting a plurality of domains formed on said sheet of magnetic material.

7. The magnetic bubble device of claim 1 wherein said intermediate edge segments comprise linear edge segments.

8. The magnetic bubble device of claim 7 wherein said linear edge segments are outwardly skewed relative to the direction of domain propagation.

9. The magnetic bubble device of claim 1 and wherein said gapless overlay has a geometry such that a major loop and at least one minor loop is produced for shifting a plurality of domains formed on said sheet of magnetic material, and wherein a first portion of the propagator pattern propagates said domains when a field is applied in the plane of the sheet and having a first rotational direction while the remaining portion holds position of said domains, and wherein a second portion of the propagator pattern propagates said domains for an applied field in said plane having a second rotational direction opposite to said first rotational direction while said first portion holds position of said domains.

10. A magnetic memory device, comprising:
a sheet of magnetic material having a preferred direction of magnetization out of the plane of said sheet; and
a continuous overlay disposed on a first side of said sheet, said continuous overlay including a plurality of stacked magnetically soft films each magnetically soft film being alternately arranged with a layer of non-magnetic material,
wherein said continuous overlay has a geometry such that a major loop and at least one minor loop is produced for shifting a plurality of domains formed on said sheet of magnetic material, and
wherein a first portion of the device propagates said domains when a field is applied in said plane having a first rotational direction while the remaining portion holds position of said domains, and wherein a second portion propagates said domains for an applied field in said plane having a second rotational direction opposite to said first rotational direction while said first portion holds position of said domains.

11. A magnetic memory device, comprising:
a sheet of magnetic material magnetized so as to produce a plurality of domains,
a gapless overlay disposed on a first side of the sheet so as to produce a continuous propagator pattern to allow a shifting of the plurality of domains along the sheet, said gapless overlay including a plurality of stacked, magnetically soft films, each magnetically soft film being alternately arranged with a layer of non-magnetic material,
wherein said gapless overlay has a geometry such that a major loop and at least one minor loop is produced for shifting a plurality of domains formed on said sheet of magnetic material, and
wherein a first portion of the propagator pattern propagates said domains when a field is applied in the plane of the sheet and having a first rotational direction while the remaining portion holds position of said domains, and wherein a second portion of the propagation pattern propagates said domains for an applied field in said plane having a second rotational direction opposite to said first rotational direction while said first portion holds position of said domains.

* * * * *